United States Patent
Uchida

(10) Patent No.: US 11,961,473 B2
(45) Date of Patent: Apr. 16, 2024

(54) DISPLAY DEVICE

(71) Applicant: SHARP KABUSHIKI KAISHA, Sakai (JP)

(72) Inventor: Seiichi Uchida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 18/034,137

(22) PCT Filed: Nov. 27, 2020

(86) PCT No.: PCT/JP2020/044228
§ 371 (c)(1),
(2) Date: Apr. 27, 2023

(87) PCT Pub. No.: WO2022/113271
PCT Pub. Date: Jun. 2, 2022

(65) Prior Publication Data
US 2023/0395023 A1   Dec. 7, 2023

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0452* (2013.01); *G09G 2300/0842* (2013.01); *G09G 2310/08* (2013.01); *G09G 2320/041* (2013.01)

(58) Field of Classification Search
CPC ......... G09G 3/3233; G09G 2300/0452; G09G 2300/0842; G09G 2310/08; G09G 2320/041; G09G 3/20; H10K 59/131
See application file for complete search history.

(56) References Cited

U.S. PATENT DOCUMENTS

| | | | | |
|---|---|---|---|---|
| 7,158,104 B2* | 1/2007 | Koyama | ................... | G09G 3/30 345/87 |
| 2003/0164813 A1* | 9/2003 | Fujii | .................... | G09G 3/3648 345/101 |
| 2004/0070558 A1* | 4/2004 | Cok | ...................... | G09G 3/3225 345/76 |
| 2006/0160255 A1* | 7/2006 | Chang | .................. | G09G 3/3258 438/22 |
| 2013/0293527 A1* | 11/2013 | Minami | ............... | G09G 3/3225 345/212 |
| 2014/0239846 A1* | 8/2014 | Shoji | ....................... | H05B 45/60 315/297 |
| 2016/0086540 A1* | 3/2016 | Kim | ..................... | G09G 3/3275 345/214 |
| 2017/0206836 A1* | 7/2017 | Kim | ..................... | G09G 3/3233 |
| 2018/0090062 A1 | 3/2018 | Nakamura | | |
| 2018/0090103 A1* | 3/2018 | Zhang | .................... | G01K 13/00 |

FOREIGN PATENT DOCUMENTS

JP    2018-054915 A    4/2018

* cited by examiner

*Primary Examiner* — Jonathan A Boyd
(74) *Attorney, Agent, or Firm* — ScienBiziP, P.C.

(57) ABSTRACT

A display device includes a pixel, wherein the pixel has a driving transistor, a monitoring transistor connected to the driving transistor, and a resistor provided in the pixel, and having one end connected between the driving transistor and the monitoring transistor, and the display device is capable of detecting a temperature of the pixel in accordance with a value of current that flows through the resistor and the monitoring transistor.

10 Claims, 7 Drawing Sheets

DISPLAY DEVICE

TECHNICAL FIELD

The disclosure relates to display devices.

BACKGROUND ART

It is known that organic light-emitting diode (OLED) display devices compensate for characteristic shifts of their driving transistors.

CITATION LIST

Patent Literature

Patent Literature 1: Japanese Unexamined Patent Application Publication No. 2018-54915

SUMMARY

Technical Problem

In monitoring the characteristics of a driving transistor, a known pixel circuit cannot identify the temperature of a pixel provided with the driving transistor.

This causes the following problem if, for instance, the pixel's temperature changes before the characteristic monitoring of the driving transistor: A characteristic shift of the driving transistor is compensated in accordance with the result of the characteristic monitoring irrespective of a temperature change in the pixel. As a result, the pixel's luminance deviates from an ideal value when the pixel's temperature gets back to its original level after the compensation, thereby degrading the display quality of the display device.

One aspect of the disclosure aims to achieve a display device with high display quality.

Solution to Problem

A display device according to one aspect of the disclosure includes a pixel, wherein the pixel has a driving transistor, a monitoring transistor connected to the driving transistor, and a resistor provided in the pixel, and having one end connected between the driving transistor and the monitoring transistor, and the display device is capable of detecting the temperature of the pixel in accordance with a value of current that flows through the resistor and the monitoring transistor.

Advantageous Effect of Disclosure

The aspect of the disclosure can achieve a display device with high display quality.

DESCRIPTION OF EMBODIMENTS

Embodiments for implementing the disclosure will be described. It is noted that for convenience in description, a component having the same function as an earlier described component will be denoted by the same sign, and that its description will not be repeated in some cases.

Figure 1:
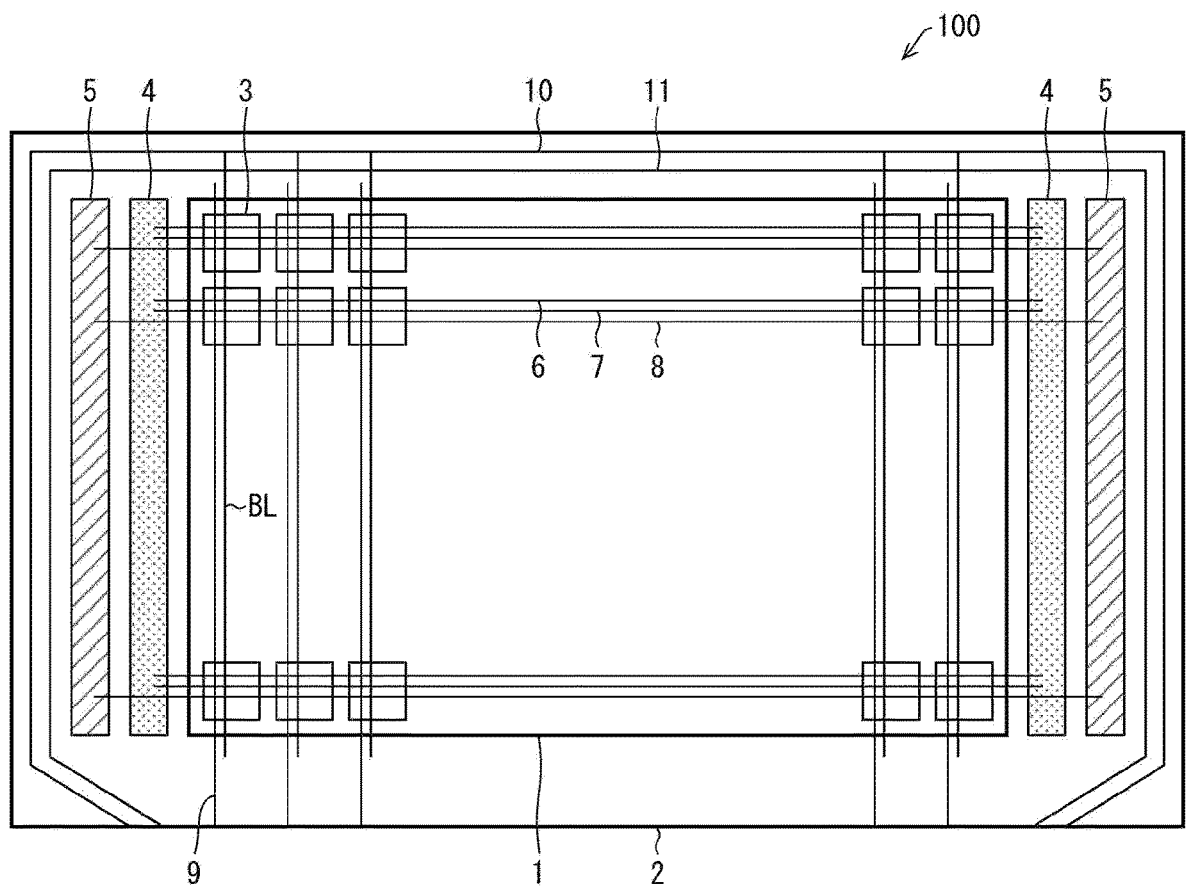
FIG. 1 is a schematic diagram of a display device according to each embodiment of the disclosure.

FIG. 1 is a schematic diagram of a display device 100 according to each embodiment of the disclosure. The display device 100 is composed of a display region 1, where display is performed, and a non-display region 2, where display is not performed. The non-display region 2 is provided so as to surround the display region 1.

The display region 1 includes many pixels 3 arranged in matrix. The non-display region 2 includes two gate-and-monitoring drivers 4 and two emission drivers 5. The two gate-and-monitoring drivers 4 are provided so as to sandwich the display region 1. The two emission drivers 5 are provided so as to sandwich the display region 1. The gate-and-monitoring drivers 4 have a gate driver that supplies a signal to the gate line 6, and a monitoring driver that supplies a signal to a monitoring line 7. The emission drivers 5 supply a signal to an emission line 8.

The display device 100 includes a plurality of gate lines 6, a plurality of monitoring lines 7, a plurality of emission lines 8, a plurality of data lines 9, a temperature-monitoring power source line (first wire) 10, and a temperature-monitoring switching line (second wire) 11.

Each gate line 6 and each monitoring line 7 are provided from one of the two gate-and-monitoring drivers 4 through the pixels 3 in a single row, provided in the display region 1, to the other one of the two gate-and-monitoring drivers 4. Each emission line 8 is provided from one of the two emission drivers 5 through the pixels 3 in a single row, provided in the display region 1, to the other one of the two emission drivers 5. The gate line 6, the monitoring line 7, and the emission line 8 are provided for every pixels 3 in a single row, provided in the display region 1.

Each data line 9 passes through the pixels 3 in a single column, provided in the display region 1. The data line 9 is provided for every pixels 3 in a single column, provided in the display region 1. The temperature-monitoring power source line 10 and the temperature-monitoring switching line 11 are routed in the non-display region 2 so as to surround the display region 1. The temperature-monitoring power source line 10 is at a constant potential. Nevertheless, the temperature-monitoring power source line 10 may change its constant potential value in conformance with a previous measurement or the environment.

The display device 100 includes a bus line BL other than the foregoing. The display device 100 also includes, but not limited to, a power source line ELVDD and a power source line ELVSS, both of which are not shown in FIG. 1, other than the foregoing.

It is noted that the display device 100 may be provided with only one of the two gate-and-monitoring drivers 4 and may be provided with only one of the two emission drivers 5.

Figure 2:
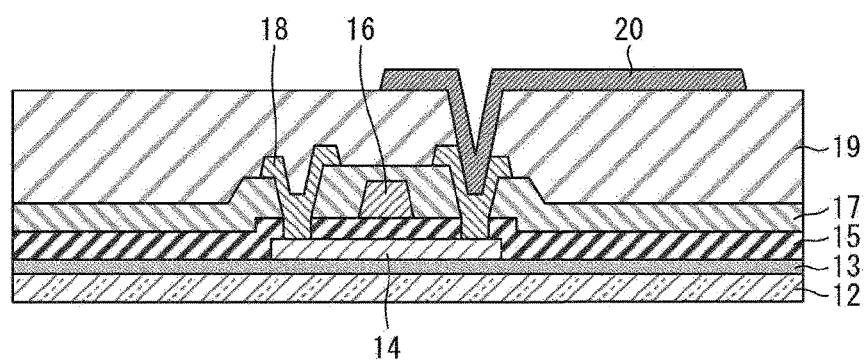
FIG. 2 schematically illustrates, in sectional view, an example method for manufacturing the display device illustrated in FIG. 1.

FIG. 2 schematically illustrates, in sectional view, an example method for manufacturing the display device 100. FIG. 2 illustrates that a pixel electrode 20 has been formed in this example.

The first process step is forming a protective film 13 onto a glass substrate 12. The protective film 13 is composed of, for instance, a stack of a SiN layer and a SiNO layer. The thickness of the protective film 13 is, for instance, 30 nm for the SiN layer and 500 nm for the SiNO layer.

The next is forming an oxide semiconductor film 14, and processing the oxide semiconductor film 14 into a desired shape through photolithography. The oxide semiconductor film 14 is composed of IGZO for instance. The oxide semiconductor film 14 at the time of film formation is 50 nm thick for instance.

The next is forming a gate insulating film 15. The gate insulating film 15 is composed of, for instance, a stack of a $SiO_2$ layer and $SiN_x$ (where X is a natural number) layer. The thickness of the gate insulating film 15 is, for instance, 50 nm for the $SiO_2$ layer and 325 nm for the $SiN_x$ layer.

The next is forming a conductive film, and processing the conductive film into a desired shape through photolithography to form the gate lines 6 (c.f., FIG. 1) and a gate electrode 16. The conductive film is composed of, for instance, a stack of a Ti layer (1), an Al layer and a Ti layer (2). The thickness of the conductive film is, for instance, 50 nm for the Ti layer (1), 100 nm for the Al layer and 50 nm for the Ti layer (2).

The next is forming an insulating film 17, and removing part of the insulating film 17 through photolithography in order to form a contact portion. The insulating film 17 is composed of, for instance, a stack of a $SiO_2$ layer and a SiN layer. The thickness of the insulating film 17 is, for instance, 380 nm for the $SiO_2$ layer and 20 nm for the SiN layer.

The next is forming a conductive film, and processing the conductive film into a desired shape through photolithography to form the data lines 9 (c.f., FIG. 1) and a source electrode 18. The conductive film is composed of, for instance, a stack of a Ti layer (A), an Al layer and a Ti layer (B). The thickness of the conductive film is, for instance, 50 nm for the Ti layer (A), 300 nm for the Al layer and 30 nm for the Ti layer (B).

The next is forming an insulating film 19, and removing part of the insulating film 19 through photolithography in order to form a contact portion. The insulating film 19 is composed of polyimide (PI) for instance. The insulating film 19 is 2500 nm thick for instance.

The next is forming a conductive film, and processing the conductive film into a desired shape through photolithography to form a pixel electrode 20. The conductive film is composed of, for instance, a stack of an indium tin oxide (ITO) layer (1), a AgA layer and an ITO layer (2). The thickness of the conductive film is, for instance, 10 nm for the ITO layer (1), 95 nm for the AgA layer and 10 nm for the ITO layer (2).

It is noted that the next is forming an insulating film (e.g., 1500 nm thick PI), and removing part of the insulating film through photolithography in order to form a contact portion. The next is forming an OLED layer, followed by forming a sealing film through CVD to seal the OLED layer. When there are a plurality of display devices 100 formed in array, the final process step is cutting out one of them.

First Embodiment

Figure 3:
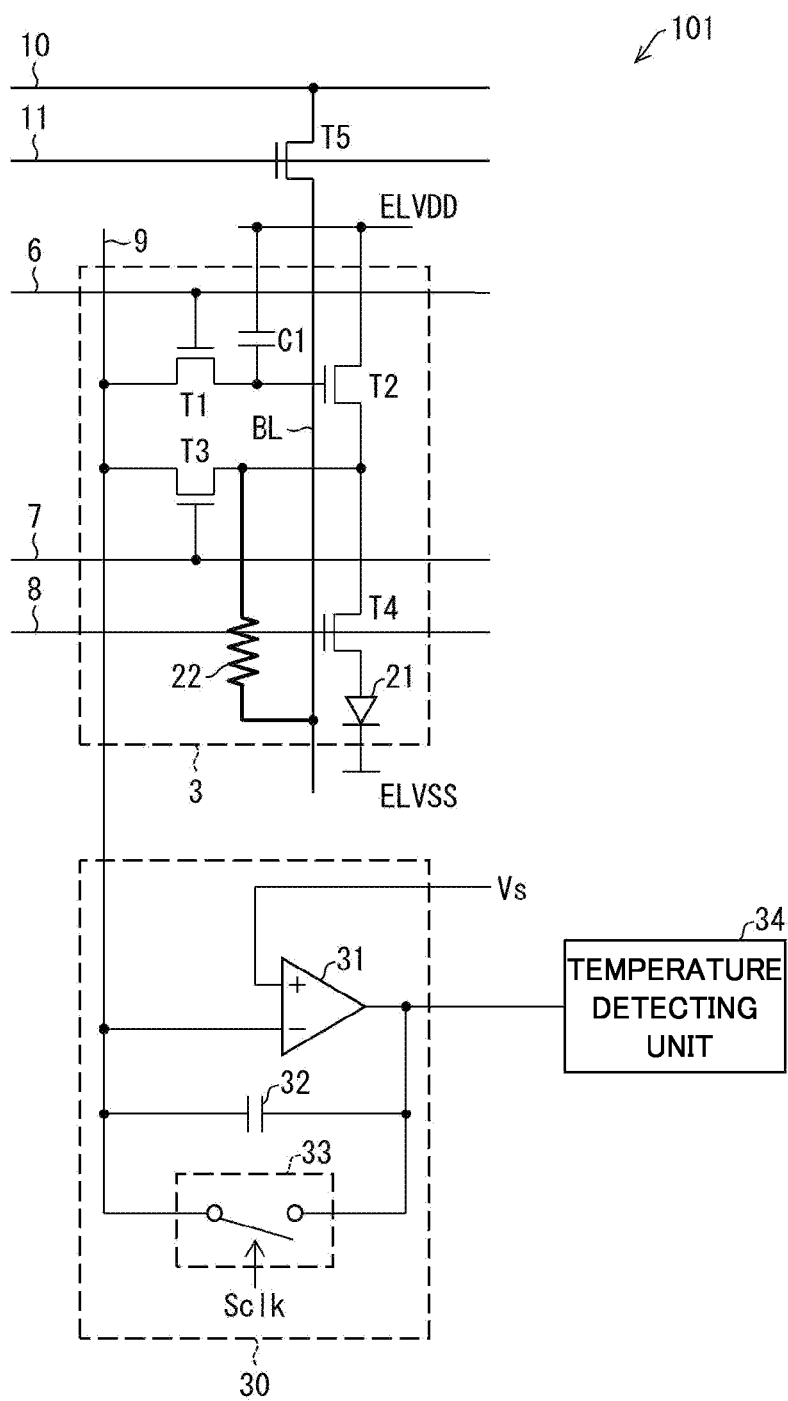
FIG. 3 is a circuit diagram illustrating the schematic configuration of a main part of the display device according to a first embodiment of the disclosure illustrated in FIG. 1.

FIG. 3 is a circuit diagram illustrating the schematic configuration of a main part 101 of the display device 100 according to a first embodiment of the disclosure. The main part 101 includes a single pixel 3 and its surroundings. The pixel 3 has a write transistor Ti, a driving transistor T2, a monitoring transistor T3, an emission transistor T4, a capacitor C1, a light-emitting element 21, and a resistor 22. Further, around the pixel 3 is a switching transistor T5. Each of these transistors is an n-channel MOSFET for instance.

The gate of the write transistor T1 is connected to the gate line 6 corresponding to the pixel 3 (hereinafter, the word "corresponding to the pixel 3" will be omitted). The write transistor T1 is also connected between the data line 9 corresponding to the pixel 3 (hereinafter, the word "corresponding to the pixel 3" will be omitted) and the gate of the driving transistor T2.

The gate of the driving transistor T2 is connected to the data line 9 via the write transistor T1. The driving transistor T2 is also connected between the power source line ELVDD and the emission transistor T4.

The gate of the monitoring transistor T3 is connected to the monitoring line 7 corresponding to the pixel 3 (hereinafter, the word "corresponding to the pixel 3" will be omitted). The monitoring transistor T3 is also connected between the data line 9 and the driving transistor T2.

The gate of the emission transistor T4 is connected to the emission line 8 corresponding to the pixel 3 (hereinafter, the word "corresponding to the pixel 3" will be omitted). The emission transistor T4 is also connected between the driving transistor T2 and the anode of the light-emitting element 21 (one of the ends of the light-emitting element).

The anode of the light-emitting element 21 is connected to the emission transistor T4. The cathode of the light-emitting element 21 is connected to the power source line ELVSS. One of the ends of the capacitor C1 is connected between the write transistor T1 and the gate of the driving transistor T2. The other end of the capacitor C1 is connected to the power source line ELVDD.

One of the ends of the resistor 22 is connected between the driving transistor T2 and the monitoring transistor T3. This end of the resistor 22 is further connected to the anode of the light-emitting element 21 via the emission transistor T4. The other end of the resistor 22 is connected to the switching transistor T5 via the bus line BL, formed in the pixel 3.

The resistor 22 preferably has a resistance value that varies conspicuously in conformance with temperature change in the resistor 22. The resistor 22 thus preferably has as large a resistor value as possible. For instance, the resistor 22 preferably has a width equal to or narrower than the width of the data line 9. The resistor 22 preferably has a length equal to or longer than the longer sides of the pixel 3. The resistor 22 is preferably made of metal having a resistivity that varies greatly, such as tungsten or nickel.

The gate (control terminal) of the switching transistor T5 is connected to the temperature-monitoring switching line 11. The switching transistor T5 is also connected between the temperature-monitoring power source line 10 and the resistor 22.

In other words, the temperature-monitoring power source line 10 is electrically connectable to the other end of the resistor 22. The switching transistor T5 switches whether to electrically connect the temperature-monitoring power source line 10 and the other end of the resistor 22 together in response to a signal that is supplied from the temperature-monitoring switching line 11 to the gate of the switching transistor T5. The temperature-monitoring switching line 11 is connected to the control terminal of the switching transistor T5.

The display device 100 provided with the main part 101 (the same holds true for main parts 102, 103 and 104, which will be described later on) is capable of detecting the temperature of the pixel 3 in accordance with a value of current that flows through the resistor 22 and monitoring transistor T3.

That is, the resistor 22 in the main part 101 is connected to a monitoring circuit 30 via the monitoring transistor T3 and the data line 9. The monitoring circuit 30 measures current that flows through the data line 9. The monitoring circuit 30 has an operational amplifier 31, a capacitor 32, and a switch 33. The operational amplifier 31 has an inverting input terminal connected to the data line 9. The operational amplifier 31 has a non-inverting input terminal to which analog voltage Vs is applied as a data signal. The capacitor 32 and the switch 33 are connected between the output terminal of the operational amplifier 31 and the data line 9. The monitoring circuit 30 is composed of an integration circuit. Upon the switch 33 being turned on by a control clock signal Sclk, the operational amplifier 31 is short-circuited between its output terminal and inverting input terminal. Accordingly, the potential at the output terminal of the operational amplifier 31 and the potential of the data line 9 become equal to the potential of the analog voltage Vs. The switch 33 is turned off by the control clock signal Sclk when the current flowing through the data line 9 is measured. Accordingly, the capacitor 32 causes the potential at the output terminal of the operational amplifier 31 to vary in conformance with the level of the current flowing through the data line 9. An output from the operational amplifier 31 is sent to a temperature detecting unit 34 as monitoring data. Based on the value of the current flowing through the data line 9, indicated by the monitoring data, the temperature detecting unit 34 detects the resistance value of the resistor 22 corresponding to this current value. The temperature detecting unit 34 then detects, as the temperature of the pixel 3, temperature at which the resistor 22 exhibits its resistance value detected by the temperature detecting unit 34.

Figure 4:
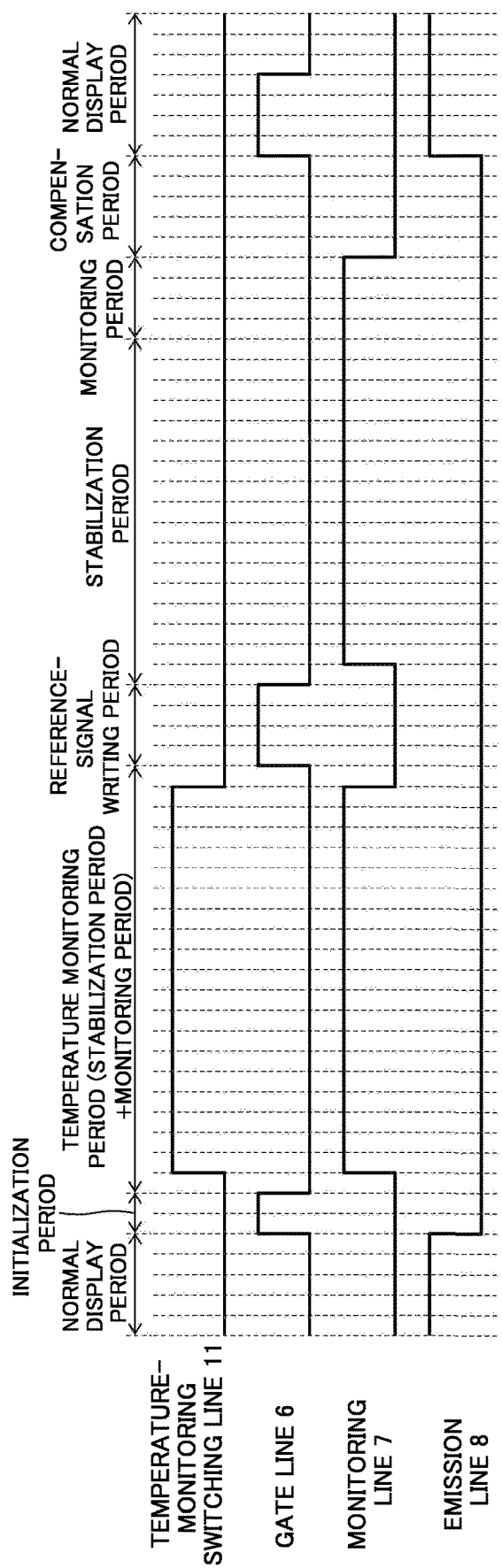
FIG. 4 is a timing chart illustrating example signals that are supplied to respective temperature-monitoring switching line, gate line, monitoring line and emission line.

FIG. 4 is a timing chart illustrating example signals that are supplied to the respective temperature-monitoring switching line 11, gate line 6, monitoring line 7 and emission line 8.

In a normal display period, during which the display device 100 performs normal display, a high-level signal is supplied to the emission line 8, and low-level signals are supplied to the temperature-monitoring switching line 11, the gate line 6 and the monitoring line 7. That is, the emission transistor T4 is ON, and the switching transistor T5, the write transistor T1 and the monitoring transistor T3 are OFF.

Then, upon a shift from the normal display period to an initialization period, the signal supplied to the gate line 6 becomes a high level, and the signal supplied to the emission line 8 becomes a low level. That is, the write transistor T1 becomes ON, and the emission transistor T4 becomes OFF.

It is noted that the initialization period is a period during which the gate potential of the driving transistor T2 is a potential for turning off the driving transistor T2. In the main part 101, the gate potential of the driving transistor T2 in the initialization period immediately before the temperature monitoring period, during which the pixel 3 undergoes temperature detection, is a potential for turning off the driving transistor T2. Further in the main part 101, the initialization period is followed by the temperature monitoring period with the gate potential of the driving transistor T2 being a potential for turning off the driving transistor T2.

Subsequently, upon a shift from the initialization period to the temperature monitoring period, the signal supplied to the gate line 6 becomes a low level firstly, and the signal supplied to the temperature-monitoring switching line 11 and the signal supplied to the monitoring line 7 become a high level subsequently. That is, the write transistor T1 becomes OFF, and the switching transistor T5 and the monitoring transistor T3 become ON subsequently.

In the temperature monitoring period, electric charge accumulated in the gate of the driving transistor T2 is initialized, and the switching transistor T5 and the monitoring transistor T3 are ON. This allows current to flow through the temperature-monitoring power source line 10, followed by the switching transistor T5, followed by the resistor 22, followed by the monitoring transistor T3, followed by the data line 9. In addition, the value of this current is measured, and based on this current value, the temperature of the pixel 3 can be detected. Specific examples of how to detect the temperature of the pixel 3 include (A) and (B) below.

(A) Define, in advance, the relationship of the temperature of the pixel 3 with respect to the difference between the foregoing current value and a predetermined reference value, and identify the temperature of the pixel 3 from the difference between an actual measurement of the current value and the reference value by referring to the relationship.

(B) Prepare, in advance, a table or graph indicating the relationship of the temperature of the pixel 3 with respect to the foregoing current value, and identify the temperature of the pixel 3 from an actual measurement of the current value by referring to the table or graph.

Subsequently, the signal supplied to the temperature-monitoring switching line 11 and the signal supplied to the monitoring line 7 become a low level immediately before a shift from the temperature monitoring period to a reference-signal writing period. That is, the switching transistor T5 and the monitoring transistor T3 become OFF.

Subsequently, upon a shift from the temperature monitoring period to the reference-signal writing period, the signal supplied to the gate line 6 becomes a high level. That is, the write transistor T1 becomes ON.

Subsequently, upon a shift from the reference-signal writing period to a stabilization period, the signal supplied to the gate line 6 becomes a low level firstly, and the signal supplied to the monitoring line 7 subsequently becomes a high level from the stabilization period through a subsequent, monitoring period. That is, the write transistor T1 becomes OFF, and the monitoring transistor T3 becomes ON subsequently.

The monitoring transistor T3 is ON in the stabilization period and the monitoring period. This allows current to flow through the power source line ELVDD, followed by the driving transistor T2, followed by the monitoring transistor T3, followed by the data line 9. In addition, the characteristics of the driving transistor T2 can be monitored by measuring the value of this current.

Subsequently, upon a shift from the monitoring period to a compensation period, during which a characteristic shift of the driving transistor T2 is compensated, the signal supplied to the monitoring line 7 becomes a low level. That is, the monitoring transistor T3 becomes OFF. The compensation for the characteristic shift of the driving transistor T2 will be detailed later on.

Finally, upon a shift from the compensation period to the normal display period, the signal supplied to the gate line 6 and the signal supplied to the emission line 8 become a high level firstly, and the signal supplied to the gate line 6 becomes a low level subsequently. That is, the write transistor T1 and the emission transistor T4 become ON, and the write transistor Ti becomes OFF subsequently.

Figure 5:
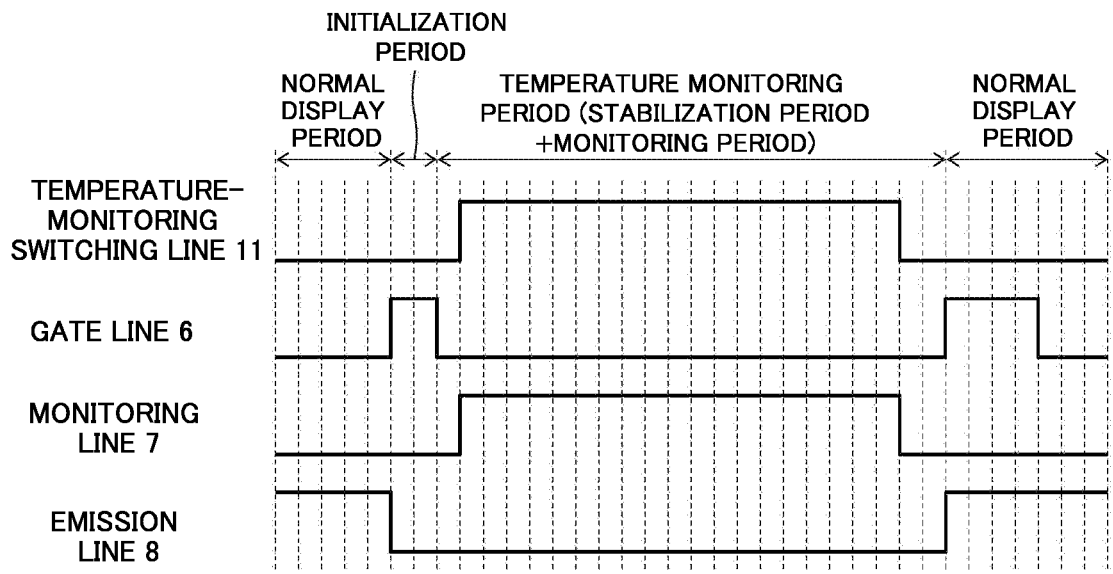
FIG. 5 is a timing chart illustrating other example signals that are supplied to the respective temperature-monitoring switching line, gate line, monitoring line and emission line.

FIG. 5 is a timing chart illustrating other example signals that are supplied to the respective temperature-monitoring switching line 11, gate line 6, monitoring line 7 and emission line 8. The temperature monitoring period in FIG. 5 is followed by the normal display period; this configuration is different from that in FIG. 4. This enables the temperature of the pixel 3 to be detected also at a timing other than the timing corresponding to the characteristic monitoring of the driving transistor T2. Consequently, a temperature change in the pixel 3 can be detected more elaborately.

The display device 100 having the main part 101 conceivably detects the temperatures of the pixels 3 for, for instance, every pixels 3 in a single row, provided in the display region 1.

Figure 6:
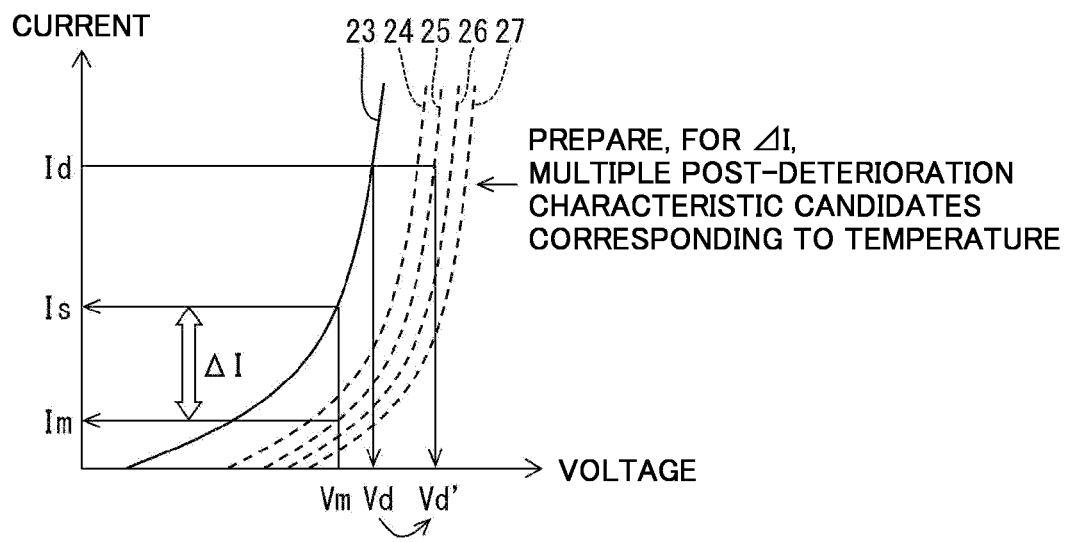
FIG. 6 is a graph showing example compensation for a voltage-current characteristic shift of a driving transistor.

FIG. 6 is a graph showing example compensation for a voltage-current characteristic shift of the driving transistor T2. The lateral axis in FIG. 6 indicates voltage, and the longitudinal axis in the same indicates current. The initial characteristic of the driving transistor T2 is indicated as an initial characteristic 23. In the initial characteristic 23, current Id flows through the driving transistor T2 upon application of voltage Vd across the driving transistor T2, and current Is flows through the driving transistor T2 upon application of voltage Vm across the driving transistor T2.

In the characteristic monitoring of the driving transistor T2, the voltage Vm is applied across the driving transistor T2. When the driving transistor T2 is deteriorated, current that flows through the driving transistor T2 with the voltage Vm applied thereacross is current Im, which is smaller than the current Is. In accordance with a difference ΔI between the current Is and the current Im, a plurality of post-deterioration characteristic candidates 24 to 27 prepared for a single value of the difference ΔI are identified. The differences between the post-deterioration characteristic candidates 24 to 27 correspond to the differences in the temperature of the pixel 3.

Furthermore, the main part 101 can detect the temperature of the pixel 3. Thus, one of the post-deterioration characteristic candidates 24 to 27 corresponding to the temperature of the pixel 3 detected by the main part 101 can be selected as a definitive post-deterioration characteristic. Herein, the post-deterioration characteristic candidate 25 is selected as a definitive post-deterioration characteristic.

In the post-deterioration characteristic candidate 25, the current Id flows through the driving transistor T2 upon application of voltage Vd' across the driving transistor T2. That is, when the current that flows through the driving transistor T2 is defined as the current Id, the voltage that is applied across the driving transistor T2 is increased from the voltage Vd to the voltage Vd'. The characteristic shift of the driving transistor T2 is compensated in this way.

The main part 101 can compensate for the characteristic shift of the driving transistor T2 in accordance with the temperature of the pixel 3. This prevents the luminance of the pixel 3 from deviating from an ideal value, thereby achieving the display device 100 with high display quality.

Second Embodiment

Figure 7:
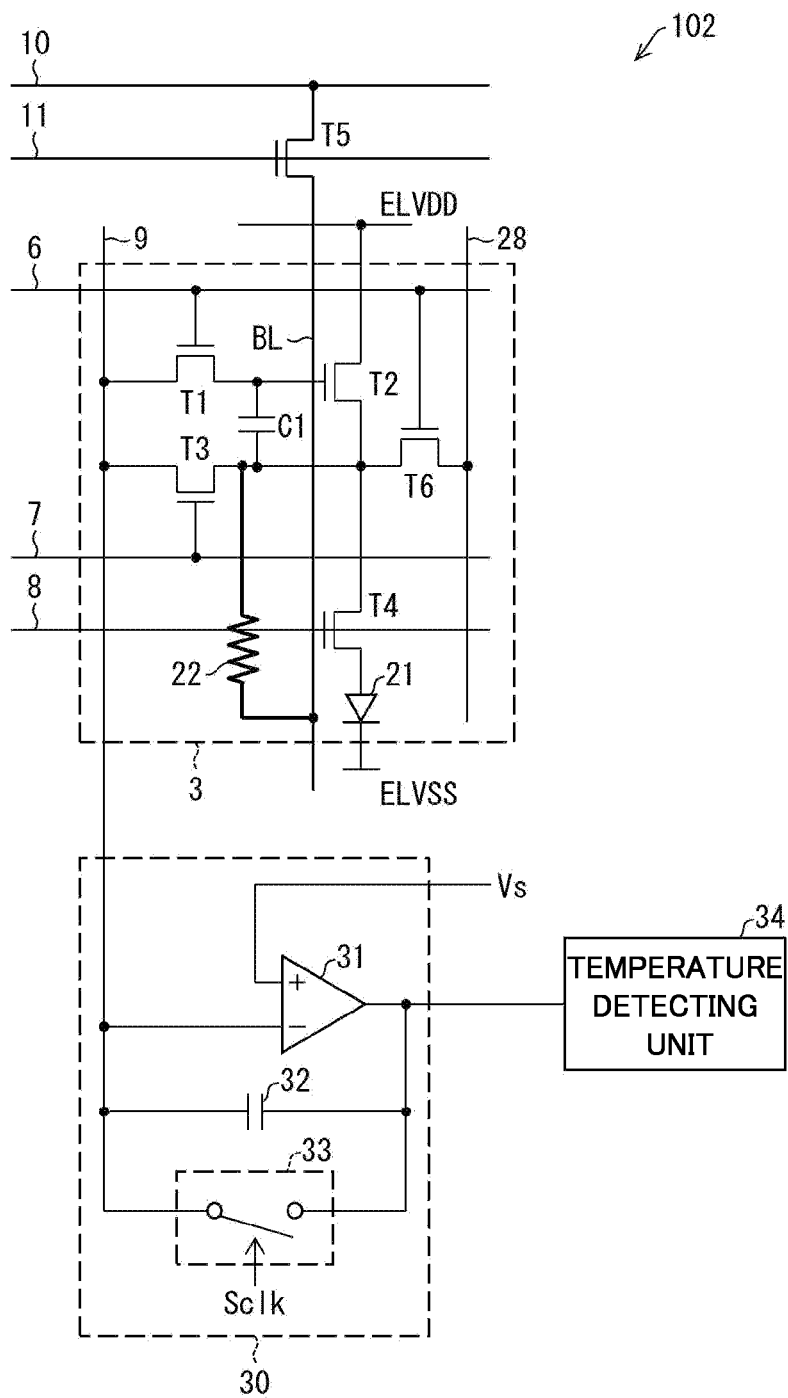
FIG. 7 is a circuit diagram illustrating the schematic configuration of a main part of the display device according to a second embodiment of the disclosure illustrated in FIG. 1.

FIG. 7 is a circuit diagram illustrating the schematic configuration of a main part 102 of the display device 100 according to a second embodiment of the disclosure.

The main part 102 is different from the main part 101 in the configuration of the connected portion at the other end of the capacitor C1. That is, the main part 102 is configured such that the other end of the capacitor C1 is connected between the monitoring transistor T3 and the driving transistor T2. In other words, the capacitor C1 is connected between the gate of the driving transistor T2 and the source of the driving transistor T2.

The main part 102 also has an initialization transistor T6 in the pixel 3 in addition to the components of the main part 101. The gate of the initialization transistor T6 is connected to the gate line 6. The initialization transistor T6 is also connected between the driving transistor T2 and an initialization line 28 corresponding to the pixel 3.

The initialization transistor T6 is connected to the source of the driving transistor T2 and initializes electric charge accumulated in the source of the driving transistor T2, every time a signal that is supplied to the gate line 6 becomes a high level. This can achieve the display device 100 that is less likely to be affected by an IR drop.

Third Embodiment

Figure 8:
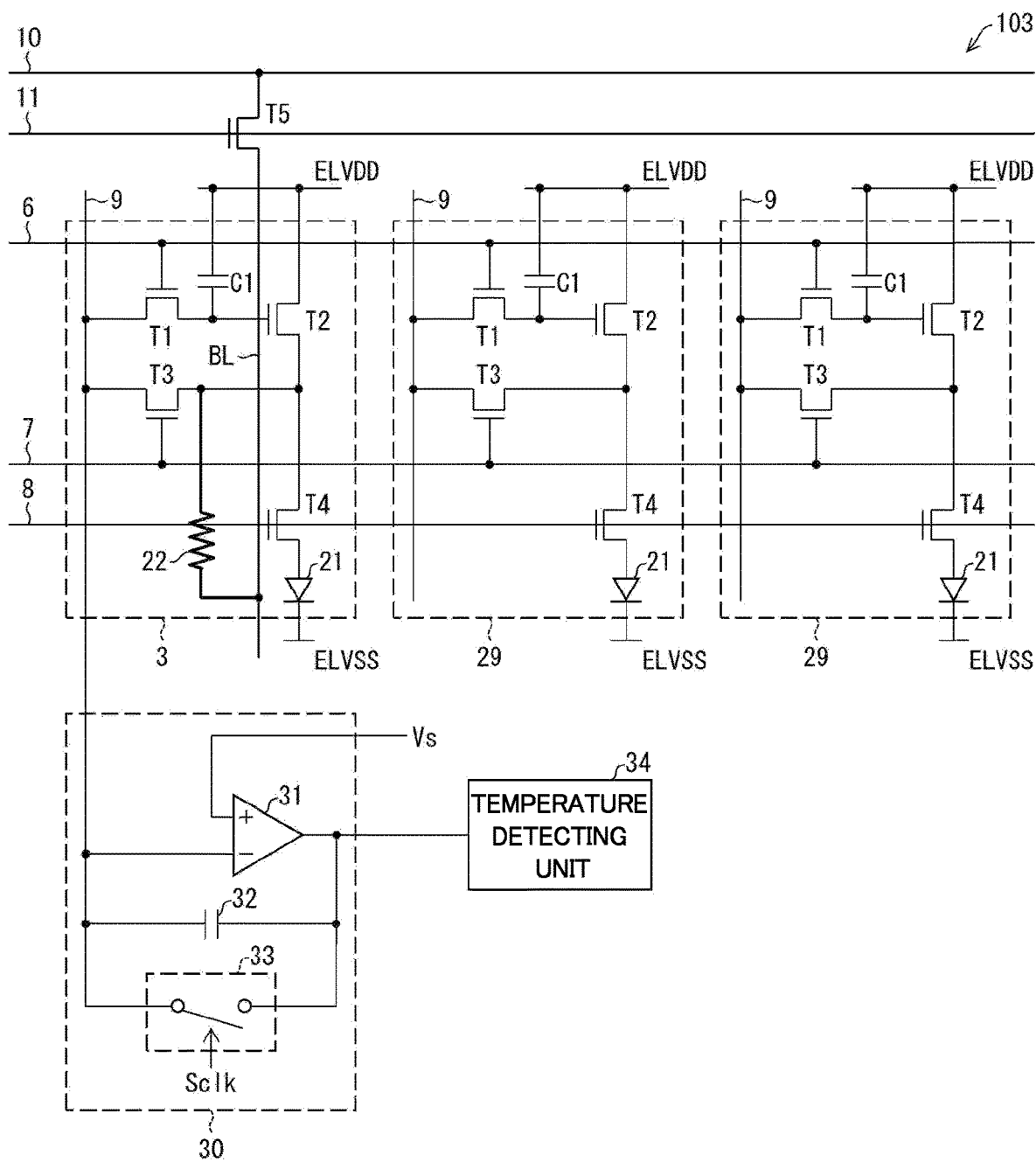
FIG. 8 is a circuit diagram illustrating the schematic configuration of a main part of the display device according to a third embodiment of the disclosure illustrated in FIG. 1.

FIG. 8 is a circuit diagram illustrating the schematic configuration of a main part 103 of the display device 100 according to a third embodiment of the disclosure. The main part 103 has two pixels 29 in addition to the components of the main part 101. The pixel 3 and the two pixels 29 are provided in the same row of the foregoing matrix. The pixel 3 and the pixels 29 are different in that the pixel 3 is provided with the resistor 22, whereas the pixels 29 are provided with no resistor 22. Moreover, no transistor corresponding to the switching transistor T5 is provided around the pixels 29. That is, the main part 103 can detect the temperature of the pixel 3, but does not have the function of detecting the temperatures of the pixels 29.

Such a configuration as described above may be provided where the temperature of only a part of a plurality of pixels is detectable.

It is noted that the pixel 3 and the two pixels 29 are conceivably a red pixel that performs red display, a green pixel that performs green display, and a blue pixel that performs blue display. The pixel 3 may be any one of the red pixel, green pixel and blue pixel.

Let the pixel 3 and the two pixels 29 constitute a single unit. The single unit is not so large (100 μm order at most); hence, within the same unit, the temperature of the pixel 3 is conceivably almost the same as the temperatures of the two pixels 29. The main part 103 is configured such that the temperature of only one of the pixel 3 and two pixels 29 is detected. This can reduce the number of bus lines BL, thus offering an advantage in layout within the display device 100.

Fourth Embodiment

Figure 9:
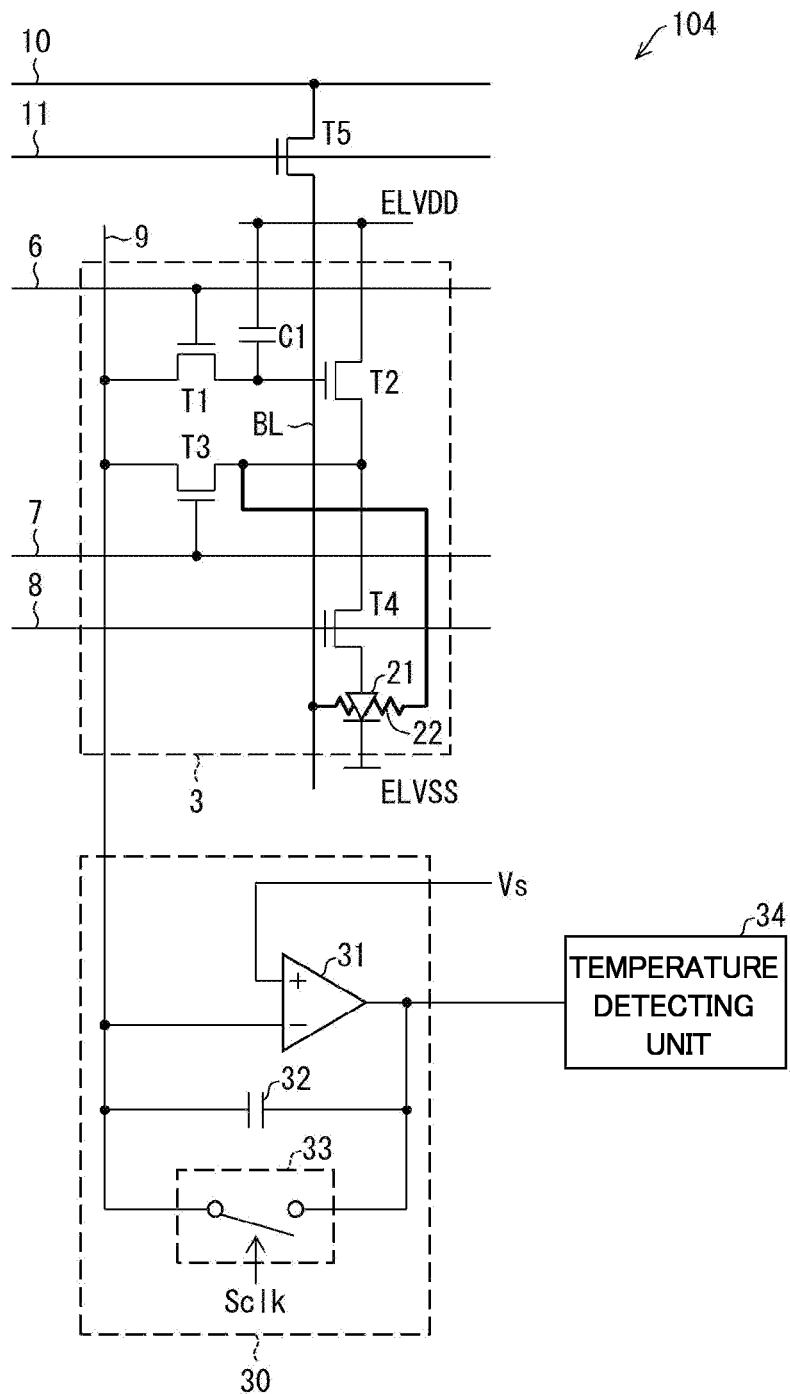
FIG. 9 is a circuit diagram illustrating the schematic configuration of a main part of the display device according to a fourth embodiment of the disclosure illustrated in FIG. 1.

FIG. 9 is a circuit diagram illustrating the schematic configuration of a main part 104 of the display device 100 according to a fourth embodiment of the disclosure. The main part 101 is configured such that the resistor 22 of the pixel 3 is provided near the light-emitting element 21 of the pixel 3, whereas the main part 104 is configured such that the resistor 22 of the pixel 3 is provided directly under the light-emitting element 21 of the pixel 3.

The temperature of the pixel 3 tends to depend greatly on emission-induced heat from the light-emitting element 21. The resistor 22 is hence preferably provided near the light-emitting element 21 and is more desirably provided directly under the light-emitting element 21.

It is noted that the main part 102 or main part 103 may be configured, like the main part 104, such that the resistor 22 of the pixel 3 is provided directly under the light-emitting element 21 of the pixel 3.

SUMMARY

A display device according to a first aspect of the disclosure includes a pixel, wherein the pixel has a driving transistor, a monitoring transistor connected to the driving transistor, and a resistor provided in the pixel, and having one end connected between the driving transistor and the monitoring transistor, and the display device is capable of detecting the temperature of the pixel in accordance with a value of current that flows through the resistor and the monitoring transistor.

The display device according to a second aspect of the disclosure has, in the first aspect, the following: a first wire (temperature-monitoring power source line 10) electrically connectable to another end of the resistor; a switching transistor configured to switch whether to electrically connect the first wire and the other end of the resistor together; and a second wire (temperature-monitoring switching line 11) connected to a control terminal of the switching transistor.

The display device according to a third aspect of the disclosure is configured, in the second aspect, such that the first wire and the second wire are provided in a non-display region of the display device.

The display device according to a fourth aspect of the disclosure is configured, in any one of the first to third aspects, such that the pixel has an initialization transistor connected to the source of the driving transistor, and a capacitor connected between the gate of the driving transistor and the source of the driving transistor.

The display device according to a fifth aspect of the disclosure includes, in any one of the first to fourth aspects, the following: a red pixel configured to perform red display; a green pixel configured to perform green display; and a blue pixel configured to perform blue display, wherein the pixel is any one of the red pixel, the green pixel and the blue pixel.

The display device according to a sixth aspect of the disclosure is configured, in any one of the first to fifth aspects, such that the pixel includes a light-emitting element, and such that the resistor is provided near or directly under the light-emitting element.

The display device according to a seventh aspect of the disclosure is configured, in any one of the first to sixth aspects, such that the resistor is connected, via the monitoring transistor and a data line corresponding to the pixel, to a monitoring circuit configured to measure current that flows through the data line.

The display device according to an eighth aspect of the disclosure is configured, in any one of the first to seventh aspects, such that the pixel includes a light-emitting element, and such that the one end of the resistor is further connected to one end of the light-emitting element.

The display device according to a ninth aspect of the disclosure has, in the eighth aspect, a first wire electrically connectable to another end of the resistor, wherein the first wire is at a constant potential.

The display device according to a tenth aspect of the disclosure is configured, in any one of the first to ninth aspects, such that the gate potential of the driving transistor immediately before a temperature monitoring period during which the pixel undergoes temperature detection is a potential for turning off the driving transistor.

The disclosure is not limited to the foregoing embodiments. Various modifications can be devised within the scope of the claims. An embodiment that is obtained in combination, as appropriate, with the technical means disclosed in the respective embodiments is also included in the technical scope of the disclosure. Furthermore, combining the technical means disclosed in the respective embodiments can form a new technical feature.

The invention claimed is:
1. A display device comprising a pixel,
wherein the pixel has
   a driving transistor,
   a monitoring transistor connected to the driving transistor, and
   a resistor provided in the pixel, and having one end connected between the driving transistor and the monitoring transistor, and
the display device is capable of detecting a temperature of the pixel in accordance with a value of current that flows through the resistor and the monitoring transistor.
2. The display device according to claim 1, comprising:
a first wire electrically connectable to another end of the resistor;
a switching transistor configured to switch whether to electrically connect the first wire and the another end of the resistor together; and
a second wire connected to a control terminal of the switching transistor.
3. The display device according to claim 2, wherein the first wire and the second wire are provided in a non-display region of the display device.
4. The display device according to claim 1, wherein the pixel has
   an initialization transistor connected to a source of the driving transistor, and
   a capacitor connected between a gate of the driving transistor and the source of the driving transistor.
5. The display device according to claim 1, to comprising:
a red pixel configured to perform red display; a green pixel configured to perform green display; and a blue pixel configured to perform blue display,
wherein the pixel is any one of the red pixel, the green pixel and the blue pixel.
6. The display device according to claim 1, wherein
the pixel includes a light-emitting element, and
the resistor is provided near or directly under the light-emitting element.
7. The display device according to claim 1, wherein the resistor is connected, via the monitoring transistor and a data line corresponding to the pixel, to a monitoring circuit configured to measure current that flows through the data line.
8. The display device according to claim 1, wherein
the pixel includes a light-emitting element, and
the one end of the resistor is further connected to one end of the light-emitting element.

9. The display device according to claim 8, comprising a first wire electrically connectable to another end of the resistor,
wherein the first wire is at a constant potential.

10. The display device claim 1, wherein a gate potential of the driving transistor immediately before a temperature monitoring period during which the pixel undergoes temperature detection is a potential for turning off the driving transistor.

* * * * *